United States Patent [19]

Inai et al.

[11] 4,209,657

[45] Jun. 24, 1980

[54] APPARATUS FOR IMMERSION-COOLING SUPERCONDUCTOR

[75] Inventors: Nobuhiko Inai, Kamakura; Akihiko Miura, Inagi, both of Japan

[73] Assignee: Tokyo Shibaura Electric Company, Limited, Kawasaki, Japan

[21] Appl. No.: 801,601

[22] Filed: May 31, 1977

[30] Foreign Application Priority Data

May 31, 1976 [JP] Japan ................................ 51/63054

[51] Int. Cl.[2] ............................................ H01L 39/02

[52] U.S. Cl. ................................ 174/15 CA; 62/55.5; 62/514 R; 335/216

[58] Field of Search .............. 174/15 R, 15 CA, 15 S; 335/300, 216; 62/55.5, 514 R, 514 JT, DIG. 12

[56] References Cited

U.S. PATENT DOCUMENTS

| | | | |
|---|---|---|---|
| 2,704,431 | 3/1955 | Steele | 174/15 CA |
| 2,901,893 | 9/1959 | Saltzman | 174/15 R X |
| 3,343,111 | 9/1967 | Kafka | 335/216 |
| 3,412,320 | 11/1968 | Marshall | 174/15 CA X |
| 3,513,421 | 5/1970 | Schindler et al. | 335/216 |
| 3,611,740 | 10/1971 | Giger | 174/15 CA X |
| 3,835,239 | 9/1974 | Schmidt et al. | 174/15 CA X |
| 4,020,275 | 4/1977 | Dean | 174/15 CA X |

*Primary Examiner*—Arthur T. Grimley

*Attorney, Agent, or Firm*—Oblon, Fisher, Spivak, McClelland & Maier

[57] ABSTRACT

An apparatus for an immersion cooled superconductor including a cryostat which comprises an envelope provided with a heat insulating member; a first low temperature liquid received in the envelope; an interior vessel made of good heat conducting material and received in the envelope in a state immersed in the low temperature liquid; a second low temperature liquid received in the interior vessel with a slightly higher temperature than the first low temperature liquid; and a superconductor wire immersed in the second low temperature liquid.

15 Claims, 2 Drawing Figures

APPARATUS FOR IMMERSION-COOLING SUPERCONDUCTOR

BACKGROUND OF THE INVENTION

FIELD OF THE INVENTION

This invention relates to an apparatus for immersion-cooled superconductor.

The apparatus for an immersion-cooled superconductor is the type in which a conductor is cooled by being directly immersed in low temperature liquid, for example, liquid helium. As is known, this type includes a natural convection system and a forced cooling system. The natural convection system is the one in which a conductor is simply immersed in a low temperature liquid, for example, liquid helium received in a cryostat. In contrast, forced cooling system is one in which a low temperature liquid in the cryostat is forcefully circulated, and a conductor is immersed in the circulating liquid. The natural convection system has a lower cooling capacity than the forced cooling system, but has an advantage over the latter system in that the cryostat has a simpler construction. In contrast, the forced cooling system has the merit of carrying out very effective cooling, though the cryostat has to be fitted with a liquid helium-circulating mechanism.

The above-mentioned natural convection system and forced cooling system are properly selected according to the construction of the apparatus used. However, both systems have the drawback of not being directly applicable to some form of apparatus for cooling a superconductor, for example, a Poloidal magnetic device of superconductive type used with a nuclear fusion reactor as described in "Superconducting Poloidal Magnets for a Tokamak Fusion Reactor" by Applicants, published in September 1976.

With the Poloidal magnetic device of a superconductive type used with a nuclear fusion pile, an amount of magnetizing current changes with time, generally leading to generation of heat in a conductor. Therefore, it may be considered that the forced cooling system having an extremely great cooling capacity has to be applied to the cooling of the Poloidal magnetic device of a superconductive type for a nuclear fusion reactor. However, the forced cooling system is supposed to present difficulties for the reasons given below in being directly applied to the cooling of the Poloidal magnetic device of superconductive type.

In the first place, the Poloidal magnetic device of a superconductive type used for a nuclear fusion reactor is bulky due to its complicated construction, complicating the liquid helium path in the cryostat. As a result, vapour bubbles released from liquid helium in the cryostat are detained in the liquid helium path, preventing some regions of the apparatus from being fully cooled.

In the second place, gas-liquid two-phase streams flow through the cryostat, making it impossible to attain the stable circulation of liquid helium, unless bubbles of helium carried into the liquid helium are properly eliminated, consequently preventing the interior of the cryostat from being effectively cooled.

SUMMARY OF THE INVENTION

It is accordingly an object of this invention to provide an apparatus for an immersion-cooled superconductor so constructed as to show a very good cooling capacity.

Another object of the invention is to provide an apparatus for an immersion-cooled superconductive magnetic device having a construction well adapted to be particularly used as a Poloidal magnetic device of a superconductive type for a nuclear fusion reactor.

According to an aspect of this invention, there is provided an apparatus for an immersion-cooled superconductor including a cryostat which comprises an envelope provided with a heat insulating means; a first low temperature liquid received in the envelope; an interior vessel made of good heat-conducting material and received in the envelope in a state immersed in the low temperature liquid; a second low temperature liquid received in the interior vessel with a slightly highly temperature than the first low temperature liquid; and a superconductor wire immersed in the second low temperature liquid.

BRIEF DESCRIPTION OF THE DRAWINGS

Various other objects, features and attendant advantages of the present invention will be more fully appreciated as the same becomes better understood from the following detailed description when considered in connection with the accompanying drawings, wherein like reference characters designate like or corresponding parts throughout the several views, and wherein.

DETAILED DESCRIPTION OF THE PREFERRED EMBODIMENTS

Figure 1:
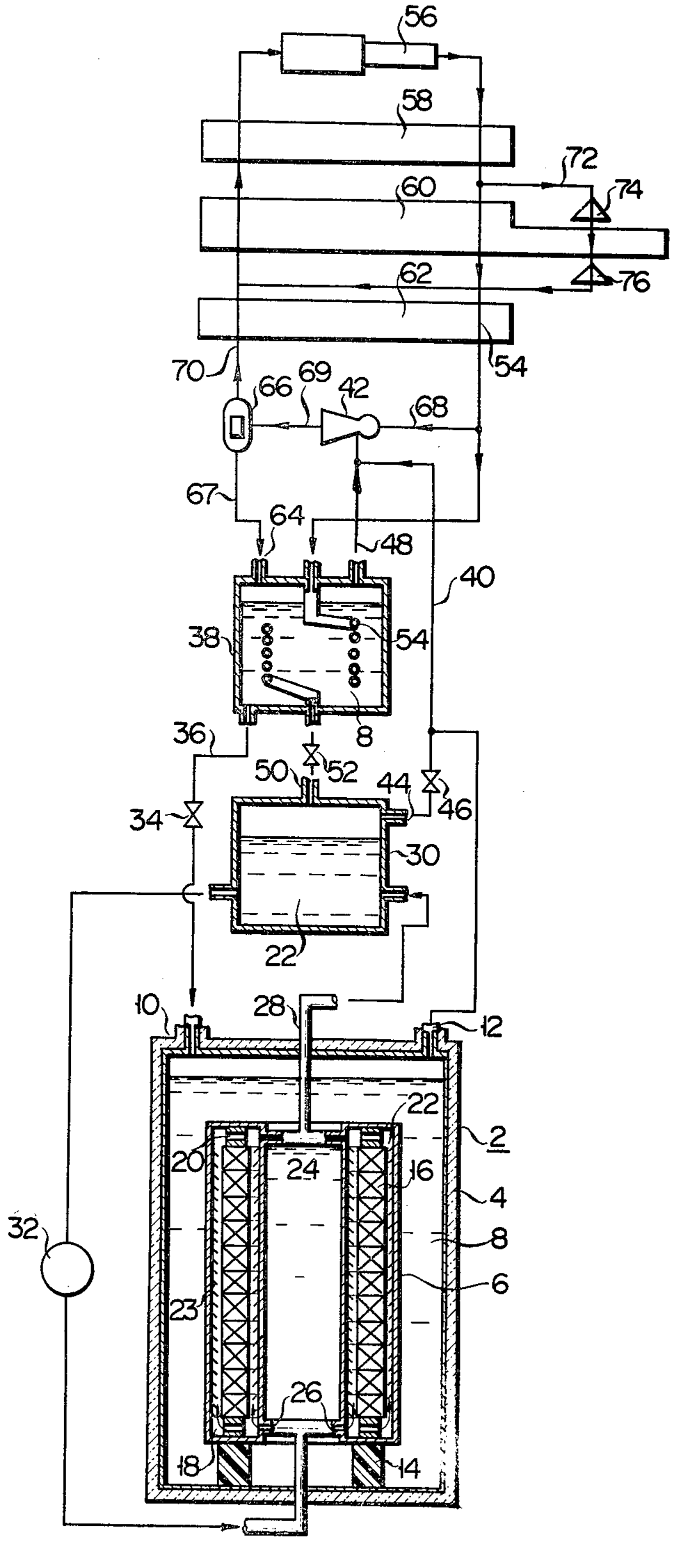
FIG. 1 schematically shows the arrangement of an apparatus for an immersion-cooled superconductor according to a preferred embodiment of this invention.

With the apparatus for an immersion-cooled superconductor shown in FIG. 1, reference numeral 2 denotes a cryostat. Unlike a convention cryostat formed of one tank, the cryostat 2 used with the apparatus of this invention has a double-tank construction comprising a hermetically sealed envelope 4 enclosed in a heat insulator and a hermetically sealed double-cylindrical interior vessel 6 built of good heat-conducting material. The envelope 4 is disposed in a vacuum case (not shown), as has been conventionally practiced. The vacuum case is in turn disposed in a heat insulative case (not shown) containing liquid nitrogen. Thus, the envelope 4 is insulated from the heat outside the heat insulative case. The envelope 4 is filled with liquid helium 8 having, for example, one atmospheric unit of pressure and an absolute temperature of 4.2° K. The interior vessel 6 is fully immersed in the liquid helium 8. The upper part of the envelope 4 is provided with an inlet 10 of the liquid helium 8 and an outlet 12 of helium vapor resulting from the vaporization of the liquid helium 8. The double-cylindrical interior vessel 6 is tightly mounted on the inner bottom wall of the envelope 4 with a spacer 14 interposed therebetween. A plurality of winding units 16 producing a magnetic field are piled one on top of another. A spacer 20 is interposed between the uppermost winding unit 16 and the upper inner wall of the interior vessel 6, and a spacer 18 is also interposed between the lowermost winding unit 16 and the lower inner wall of the interior vessel 6 in order to prevent the winding units 16 from contacting the inner walls of the interior vessel 6. Further, the winding units 16 are spaced from the lateral walls of the interior vessel 6 at a prescribed distance, and connected in series. A lead wire thereof (not shown) penetrates the interior vessel 6 and the envelope 4 in airtightness and is drawn outside.

The interior vessel 6 is filled with a second source of liquid helium 22 having a slightly higher temperature than the liquid helium 8 received in the envelope 4, a high pressure of, for example, 1.5 atmospheric units and low temperature, for example, and an absolute temperature of 4.7° K. The upper part of the interior vessel 6 is provided with an outlet 24 and the lower part of the interior vessel 6 with an inlet 26 for circulation of the second liquid helium 22. The outlet 24 is connected through an outlet pipe 28 with a second storage tank 30 of the liquid helium 22. The inlet 26 is connected with the second storage tank 30 through an inlet pipe 34 to which a pump 32 is connected. The pump 32 forcefully circulates the liquid helium 22 received in the second storage tank 30 and interior vessel 6. With the preferred embodiment, a large number of obliquely downward extending fins 23 of good heat conductivity are provided which projects from the inner wall of the interior vessel 6.

The inlet 10 of the first liquid helium 8 received in the envelope 4 communicates with a first liquid helium storage tank 38 through an inlet pipe 36 in which a flow rate control valve 34 is mounted. This flow rate control valve 34 controls the rate at which the liquid helium 8 flows from the first liquid helium storage tank 38 to the envelope 4.

The outlet 12 of vaporized helium remaining in the envelope 4 communicates with an ejector 42 through a vaporized helium outlet pipe 40. An outlet 44 of vaporized helium remaining in the second liquid helium storage tank 30 is connected to the outlet pipe 40 through a pressure control valve 46. This pressure control valve 46 is intended to fix the interior pressure of the second liquid helium storage tank 30 and conducts vaporized helium remaining in the second liquid helium storage tank 30 to the outlet pipe 40 after reducing the pressure of the vaporized helium. The outlet pipe 40 is connected to an inlet 48 of vaporized helium remaining in the first liquid helium storage tank 38.

The upper part of the second liquid helium storage tank 30 is provided with an inlet 50 of the liquid helium. This inlet 50 is connected to a heat exchanger pipe 54 through a Joule Thomson valve 52 (hereinafter referred to as a J. T. valve) intended to liquefy gaseous helium of low temperature and high pressure by rapidly expanding it. The heat exchanger pipe 54 is immersed in the first liquid storage tank 38 to decrease the temperature of gaseous helium at low temperature and high pressure flowing through the heat exchanger pipe 54. This heat exchanger pipe 54 passes through the first, second and third heat exchangers 58, 60, 62 and is connected to a helium compressor 56.

The upper part of the first liquid helium storage tank 38 is fitted with a liquid helium inlet 64. This liquid helium inlet 64 is connected through an inlet pipe 67 to a mist separator 66 which separates gaseous helium from liquid helium. The ejector 42 connected to pipes 68, 69 is disposed between the mist separator 66 and heat exchanger pipe 54. The ejector 42 liquefies by rapid expansion the gaseous helium of low temperature and high pressure which has been conducted through the heat exchanger pipe 54, and sends forth the liquefied helium to the mist separator 66. The mist separator 66 is connected to an exhaust pipe 70 which passes through the heat exchangers 58, 60, 62 and is connected to the helium compressor 56. The heat exchanger pipe 54 is connected to a cooling pipe 72 for cooling the second heat exchanger 60. This cooling pipe 72 is connected to the exhaust pipe 70 through the first and second expanders 74, 76. Part of the cooling pipe 72 runs through the second heat exchanger 60, thereby causing the second heat exchanger 60 to be cooled by the high pressure gaseous helium which is cooled when expanded by the expanders 74, 76. Like the envelope 4, the first liquid helium storage tank 30, the second liquid helium storage tank 38, etc. are disposed in an heat insulative case (not shown) containing liquid nitrogen.

There will now be described the operation of the apparatus for an immersion-cooled superconductor of this invention which is constructed as described above. High pressure gaseous helium compressed by the helium compressor 56 is cooled while passing through the heat exchangers 58, 60, 62 and is conducted to the ejector 42. Part of the high pressure gaseous helium is brought into the heat exchanger pipe 54 disposed in the first liquid helium storate tank 38 for further cooling and delivered to the J. T. valve 52. The other part of the high pressure gaseous helium entering the ejector 42 is liquefied and sent forth to the mist separator 66. That portion of the gaseous helium which has not been liquefied by the ejector 42 is removed by the mist separator 66 and fed back to the helium compressor 56. The liquefied helium is carried from the mist separator 66 to the first liquid helium storage tank 38.

Gaseous helium of low temperature and high pressure supplied to the J. T. valve 52 is liquefied and transferred to the second liquid helium storage tank 30. Liquid helium 22 at low temperature and high pressure which has entered the second liquid helium storage tank 30 is discharged into the interior vessel 6 by the pump 32, and then fed back to the second liquid helium storage tank 30. Though part of the liquid helium 22 received in the second liquid helium storage tank 30 is vaporized, yet the internal pressure of said tank 30 is always maintained at a prescribed level by the pressure control valve 46. Part of the vaporized helium has its pressure reduced by the pressure control valve 46 and is returned to the helium compressor 56 through the ejector 42 and mist separator 66.

The liquid helium 8 held in the first liquid helium storage tank 38 runs into the envelope 4 with the flow rate controlled by the flow rate control valve 34. That portion of the liquid helium now brought into the envelope 4 which has been vaporized is fed back to the helium compressor 56 through the ejector 42 and mist separator 66.

With the apparatus for immersion-cooling superconductor which is operated as described above, the winding units 16 of the cryostat 2 are cooled by the helium liquids 8, 22.

A heat buildup often arises in the winding units 16 due to a magnetic flux jump. If this condition is allowed to stand, then various undesirable results will occur. According to the cryostat used with the apparatus of this invention, therefore, heat generated in the winding units 16 is absorbed in the second liquid helium 22 received in the interior vessel 6 and the first liquid helium 8 held in the envelope 4 and is eventually released to the outside. When the winding units 16 give forth heat, the liquid helium 22 in which the winding units 16 are immersed boils up. This boiling eventually cools the winding units 16. General, vapor bubbles resulting from the boiling of the second liquid helium 22 are attached to the winding units 16 and obstruct the cooling of the winding units 16. Since, however, the interior vessel 6 of good heat conductivity which holds the liquid helium 22 is immersed in liquid helium 8 having a lower temperature than liquid helium 22, the vapor bubbles are condensed upon contact with the inner wall of the interior vessel 6 and disappear very quickly. Further, liquid helium 22 received in the interior vessel 6 is made to circulate by the pump 32 and is always maintained at extremely low temperature, thereby offering the advantage of causing helium bubbles to be readily deposited on the inner wall of the interior vessel 6. With the preferred embodiment, the inner wall of the interior vessel 6 is provided with a large number of obliquely downward extending fins 23 of good heat conductivity, enabling vapor helium bubbles to be more easily trapped and, moreover, enlarging the total surface area of the inner wall of the interior vessel 6. Therefore, provision of such numerous fins 23 allows for easy adsorption of helium bubbles to the inner wall of the interior vessel 6 and consequently quicker disappearance of the same.

Heat consumed to condense and to eliminate the helium bubbles is released to the liquid helium 8 received in the envelope 4 through the interior vessel 6 of good heat conductivity. Should vapor bubbles arise in the first liquid helium 8 filled in the envelope 4 by heat expelled from the interior vessel 6, bubbles are easily drawn off outside of the envelope 4 through the outlet 12 thereof, because the envelope 4 has a simple construction.

As mentioned above, the apparatus of this invention has the advantages that helium remaining in a substantially liquid phase always contacts a heat-generating body, that is, an assembly of winding units 16 and consequently pressure loss of liquid helium is more reduced than in the case of the liquid helium used with the prior art apparatus into which an appreciable amount of helium bubbles is carried, a constant amount of liquid helium is always made to circulate through the apparatus and as a result, the winding units are kept at an extremely low temperature.

Figure 2:
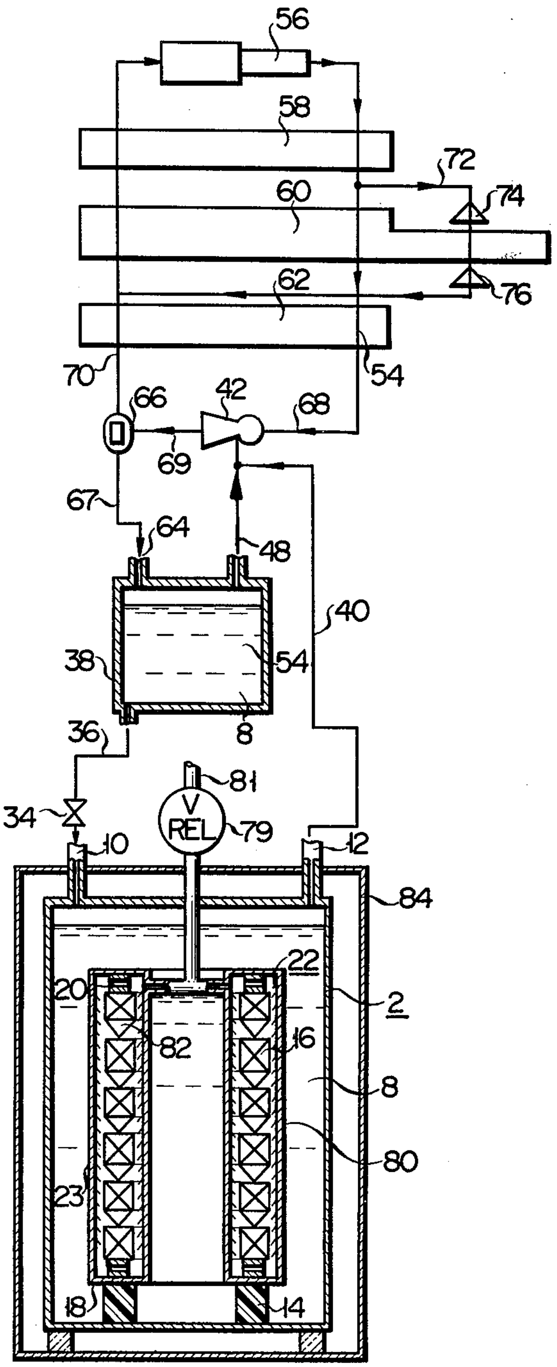
FIG. 2 schematically shows the arrangement of an apparatus for an immersion-cooled superconductor according to another embodiment of this invention.

FIG. 2 schematically shows the arrangement of an apparatus for an immersion-cooled superconductor according to another embodiment of this invention. The parts of FIG. 2 the same as those of FIG. 1 are denoted by the same numerals. As clearly seen from a comparison between the embodiments of FIGS. 1 and 2, the interior vessel 80 of FIG. 2 constitutes a sealed vessel by itself, unlike that of FIG. 1, and is not provided with an outlet 24 and inlet 26. Namely, with the embodiment of FIG. 2, the second liquid helium 22 is fully sealed in the interior vessel 80. Therefore, the embodiment of FIG. 2 omits a circulation system of a second liquid helium which comprises the second storage tank 30 and pipe 28, and a liquefaction system formed of the J. T. valve 52 and heat exchanger pipe 54. A pressure relief value 79 is connected to the upper part of the interior vessel 80 through a pipe 81 connected thereto. This pressure relief value 79 is an emergency safety valve used to reduce the internal pressure of the interior vessel 80 if such internal pressure rises abnormally high in the interior vessel 80 with the possible destruction thereof. With the embodiment of FIG. 2, a plurality of winding units 16 are spatially arranged. A plate 82 is provided in the respective spaces between the winding units 16 to guide bubbles of gaseous helium produced by the winding units 16 to the inner wall of the interior vessel 80. The plate 82 is made of heat-conducting material and has a V-shaped cross section. The envelope 4 is enclosed, as shown in FIG. 2, in a heat-insulating vessel 84 to be thermally insulated from the outside. A space between the heat-insulating vessel 84 and envelope 4 is evacuated. Therefore, envelope 4 would not have to be enclosed in the heat insulator, if so desired.

With the apparatus of FIG. 2 arranged as described above, heat generated by the plural winding units 16 causes the sealed liquid helium 22 to have a slightly higher temperature than the liquid helium 8 with the resultant occurrence of bubbles. The bubbles are collected in the V-shaped plates 82 and guided to the lateral walls of the interior vessel 80 along the inclined walls of said plates 82. Upon contact with the lateral walls of the interior vessel 6 cooled by the first liquid helium 8, the bubbles of gaseous helium are condensed and quickly disappear.

As apparent from the foregoing description, this invention particularly allows for a circulation system of liquid helium to be modified in various ways, and moreover makes it unnecessary to provide a circulation system of the second liquid helium. Namely, the apparatus according to the embodiment of FIG. 2 can effectively cool the winding units 16 received in the interior vessel 6 even without the circulation system of the second liquid helium.

Obviously, many modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An apparatus for an immersion-cooled superconductor including a cryostat which comprises an envelope provided with a heat-insulating means; a first low temperature liquid received in said heat-insulating vessel; an interior vessel made of good heat-conducting material and immersed in the first low temperature liquid; a second low temperature liquid which is higher in temperature than said first low temperature liquid and is held in the interior vessel; and a superconductor immersed in said second low temperature liquid.

2. The apparatus for immersion-cooled superconductor according to claim 1, which further includes means for guiding bubbles of the second low temperature liquid occurring in the interior vessel to its inner wall.

3. The apparatus for immersion-cooled superconductor according to claim 1, which further includes means for forcefully circulating the second low temperature liquid received in the interior vessel through a circulating path.

4. The apparatus for immersion-cooled superconductor according to claim 1, wherein the interior vessel has its inner wall fitted with a large number of fins of good heat conductivity.

5. The apparatus for immersion-cooled superconductor according to claim 1, wherein the first and second low temperature liquids are liquid helium.

6. An apparatus for an immersion-cooled superconductor including a cryostat which comprises an envelope provided with a heat insulating means, a first low temperature liquid received in the heat-insulating vessel, an interior vessel made of good heat-conducting material and immersed in the first low temperature liquid, a second low temperature liquid which is higher in temperature than the first low temperature liquid and is held in the interior vessel, a superconductor immersed in the second low temperature liquid; a first storage tank of the first low temperature liquid for supplying said first low temperature liquid to the envelope, and means for supplying the first low temperature liquid to the first storage tank.

7. The apparatus for immersion-cooled superconductor according to claim 6, which further includes means for guiding bubbles of the second low temperature liquid occurring in the interior vessel to its inner wall.

8. The apparatus for immersion-cooled superconductor according to claim 6, which further includes means for forcefully circulating the second low temperature liquid received in the interior vessel through a circulating path.

9. The apparatus for immersion-cooled superconductor according to claim 8, which further includes a second storage tank of the second low temperature liquid provided in the circulation path of the circulation means and means for supplying the second low temperature liquid to the second storage tank.

10. The apparatus for immersion-cooled superconductor according to claim 6, wherein the interior vessel has its inner wall fitted with a large number of fins of good heat conductivity.

11. The apparatus for immersion-cooled superconductor according to claim 6, wherein the first and second low temperature liquids are liquid helium.

12. The apparatus for immersion-cooled superconductor according to claim 6, wherein the envelope and first liquid helium storage tank are each provided with an outlet of gaseous helium resulting from the vaporization of the low temperature liquid helium received in said envelope and said first liquid helium storage tank.

13. The apparatus for immersion-cooled superconductor according to claim 9, wherein the second liquid helium storage tank is provided with an outlet of gaseous helium resulting from the vaporization of the low temperature liquid helium received in said second liquid helium storage tank.

14. The apparatus for immersion-cooled superconductor having the first liquid storage tank according to claim 6, which further includes a second storage tank of the second low temperature liquid for supplying the second low temperature liquid and means for supplying the second low temperature liquid to the second tank, said means for supplying the first and second low temperature liquids comprising a common gas compressor for compressing gaseous helium into the liquid form, a common heat exchanger for cooling high pressure gaseous helium compressed by the gas compressor and two corresponding devices for liquefying gaseous helium of low temperature and high pressure cooled by the heat exchanger into first and second low temperature liquid helium.

15. The apparatus for an immersion-cooled superconductor according to claim 14, wherein the device for liquefying gaseous helium into the first low temperature liquid helium liquefies gaseous helium of low temperature and high pressure conducted through a heat exchanger pipe provided in the first liquid helium storage tank.

* * * * *